(12) United States Patent
Lee et al.

(10) Patent No.: US 6,921,505 B2
(45) Date of Patent: Jul. 26, 2005

(54) HOLE FILLING USING AN ETCHED HOLE-FILL STAND-OFF

(75) Inventors: Bruce W. Lee, Chippewa Falls, WI (US); Jesse L. Pedigo, Chippewa Falls, WI (US)

(73) Assignee: TTM Advanced Circuits, Inc., Chippewa Falls, WI (US)

( * ) Notice: Subject to any disclaimer, the term of this patent is extended or adjusted under 35 U.S.C. 154(b) by 420 days.

(21) Appl. No.: 10/040,118

(22) Filed: Jan. 3, 2002

(65) Prior Publication Data

US 2002/0089086 A1 Jul. 11, 2002

Related U.S. Application Data

(63) Continuation-in-part of application No. 09/752,503, filed on Dec. 28, 2000, now Pat. No. 6,506,332.
(60) Provisional application No. 60/208,456, filed on May 31, 2000.

(51) Int. Cl.[7] ............................. B29C 67/08; B29C 70/88
(52) U.S. Cl. ........................ 264/105; 264/139; 264/267; 264/273; 427/97.7; 427/282
(58) Field of Search ............................... 264/104, 105, 264/139, 250, 254, 267, 273; 29/852, 830, 846; 427/97.2, 97.7, 282, 97

(56) References Cited

U.S. PATENT DOCUMENTS

| | | | |
|---|---|---|---|
| 3,601,523 A | 8/1971 | Arndt ........................ 174/68.5 |
| 4,106,187 A | 8/1978 | Smith et al. ................... 29/625 |
| 4,283,243 A | 8/1981 | Andreades et al. ......... 156/237 |
| 4,360,570 A | 11/1982 | Andreades et al. ......... 428/596 |
| 4,445,952 A | * 5/1984 | Reynolds et al. ............. 156/94 |
| 4,622,239 A | 11/1986 | Schoenthaler et al. ........ 427/96 |
| 4,700,474 A | 10/1987 | Choinski ..................... 29/846 |
| 4,777,721 A | 10/1988 | Choinski ..................... 29/846 |
| 4,783,247 A | 11/1988 | Seibel ...................... 204/181.1 |
| 4,884,337 A | * 12/1989 | Choinski ..................... 29/846 |
| 4,945,313 A | 7/1990 | Brilka et al. ................. 329/349 |

(Continued)

FOREIGN PATENT DOCUMENTS

| | | |
|---|---|---|
| EP | 0 194 247 A2 | 9/1986 |
| EP | 0194247 | 9/1986 |
| EP | 0 713 358 A2 | 5/1996 |

(Continued)

OTHER PUBLICATIONS

Via Etching Process, Feb. 1972.
Multilayer Printed Circuit Board Connections, Apr. 1996.
Process for Forming Copper Clad Vias, Aug. 1989.
Via Etching Process, Feb. 1972.
Multilayer printed Circuit Board Connections, Apr. 1996.
Process for Forming Copper Clad Vias, Aug. 1989.

*Primary Examiner*—Angela Ortiz
(74) *Attorney, Agent, or Firm*—Greenberg Traurig LLP; Mark Krietzman, Esq.

(57) ABSTRACT

An assembly is disclosed that includes an etched hole-fill standoff; a tooling plate contacting the etched hole-fill stand-off, the stand-off and tooling plate being aligned to each other; a device having holes to be filled removably contacting the stand-off, the stand-off and device being aligned to each other; the device and the stand-off each having at least one hole, the hole of the device being aligned with the hole of the stand-off. An assembly is also disclosed comprising an etched hole-fill standoff, the stand-off comprising an etched layer bonded to a non-etched layer. A method of filling holes in a substrate having a plurality of holes to be filled includes the steps of providing an etched hole-fill stand-off, aligning the stand-off to a tooling plate, aligning the substrate to the stand off and placing the substrate in contact with the stand-off, and filling the plurality of holes of the substrate.

4 Claims, 2 Drawing Sheets

U.S. PATENT DOCUMENTS

| | | | | |
|---|---|---|---|---|
| 4,964,948 | A | 10/1990 | Reed | 156/659 |
| 4,995,941 | A | 2/1991 | Nelson et al. | 156/630 |
| 5,053,921 | A | 10/1991 | Nelson et al. | 361/386 |
| 5,058,265 | A | 10/1991 | Goldfarb | 29/852 |
| 5,117,069 | A | 5/1992 | Higgins | 174/261 |
| 5,133,120 | A | 7/1992 | Kawakami et al. | 29/852 |
| 5,145,691 | A | 9/1992 | Kawakami et al. | 425/110 |
| 5,220,723 | A | 6/1993 | Okada | 29/830 |
| 5,274,916 | A | 1/1994 | Kawabata et al. | 29/848 |
| 5,277,854 | A | 1/1994 | Hunt | 264/86 |
| 5,332,439 | A | 7/1994 | Watanabe et al. | 118/213 |
| 5,451,721 | A | 9/1995 | Tsukada et al. | 174/261 |
| 5,456,004 | A | 10/1995 | Swamy | 29/852 |
| 5,471,091 | A | 11/1995 | Pasch et al. | 257/752 |
| 5,532,516 | A | 7/1996 | Pasch et al. | 257/752 |
| 5,540,779 | A | 7/1996 | Andris et al. | 118/692 |
| 5,578,151 | A | 11/1996 | Andris et al. | 156/64 |
| 5,591,353 | A | 1/1997 | Davignon et al. | 216/18 |
| 5,610,103 | A | 3/1997 | Xu et al. | 437/225 |
| 5,637,834 | A | 6/1997 | La Bate et al. | 174/264 |
| 5,662,987 | A | 9/1997 | Mizumoto et al. | 428/209 |
| 5,699,613 | A | 12/1997 | Chong et al. | 29/852 |
| 5,707,575 | A | 1/1998 | Litt et al. | 264/104 |
| 5,744,171 | A | 4/1998 | Schneider | 425/110 |
| 5,744,285 | A | 4/1998 | Felten et al. | 430/318 |
| 5,753,976 | A | 5/1998 | Harvey | 257/774 |
| 5,761,803 | A | 6/1998 | St. John et al. | 29/852 |
| 5,766,670 | A | 6/1998 | Arldt et al. | 427/8 |
| 5,822,856 | A | 10/1998 | Bhatt et al. | 29/832 |
| 5,824,155 | A | 10/1998 | Ha et al. | 118/410 |
| 5,851,344 | A | 12/1998 | Xu et al. | 156/379.6 |
| 5,906,042 | A | 5/1999 | Lan et al. | 29/852 |
| 5,925,414 | A | 7/1999 | Buechele et al. | 427/282 |
| 5,994,779 | A | 11/1999 | Gardner et al. | 257/773 |
| 6,000,129 | A | 12/1999 | Bhatt et al. | 29/852 |
| 6,009,620 | A | 1/2000 | Bhatt et al. | 29/852 |
| 6,015,520 | A | 1/2000 | Appelt et al. | 264/104 |
| 6,079,100 | A | 6/2000 | Farquhar et al. | 29/852 |
| 6,090,474 | A | 7/2000 | Johansson et al. | 428/209 |
| 6,106,891 | A | 8/2000 | Kulesza et al. | 427/97 |
| 6,138,350 | A | 10/2000 | Bhatt et al. | 29/852 |
| 6,149,857 | A | 11/2000 | McArdle et al. | 264/429 |
| 6,153,508 | A | 11/2000 | Harvey | 438/622 |
| 6,184,133 | B1 | 2/2001 | Iijima et al. | 438/667 |
| 6,261,501 | B1 | 7/2001 | Miyagawa et al. | 264/272.15 |
| 6,276,055 | B1 * | 8/2001 | Bryan et al. | 29/852 |
| 6,281,448 | B1 | 8/2001 | Tsukamoto | 174/260 |
| 6,282,782 | B1 * | 9/2001 | Biunno et al. | 29/852 |
| 6,659,328 | B2 * | 12/2003 | Dances | 228/22 |

FOREIGN PATENT DOCUMENTS

| | | |
|---|---|---|
| EP | 0713358 | 5/1996 |
| EP | 0 723 388 A1 | 7/1996 |
| EP | 0723388 | 7/1996 |
| FR | 2 684 836 | 12/1991 |
| FR | 2684836 | 6/1993 |
| FR | 2714567 | 6/1995 |
| FR | 2 714 567 | 6/1995 |
| GB | 2 120 017 A | 11/1983 |
| GB | 2120017 | 11/1983 |
| GB | 2246912 | 2/1992 |
| GB | 2 246 912 A | 2/1992 |
| GB | 2 341 347 A | 3/2000 |
| GB | 2341347 | 3/2000 |
| JP | 53-104857 | 9/1978 |
| JP | 54139065 | 10/1979 |
| JP | 54-139065 | 10/1979 |
| JP | 8011172 | 1/1983 |
| JP | 58011172 | 1/1983 |
| JP | 62-277794 | 12/1987 |
| JP | 62277794 | 12/1987 |
| JP | 62287696 | 12/1987 |
| JP | 62-287696 | 12/1987 |
| JP | 1173696 | 7/1989 |
| JP | 1236694 | 9/1989 |
| JP | 03004595 | 1/1991 |
| JP | 3004595 | 1/1991 |
| JP | 4186792 | 7/1992 |
| JP | 04186792 | 7/1992 |
| JP | 04239193 | 8/1992 |
| JP | 4239193 | 8/1992 |
| JP | 5275819 | 10/1993 |
| JP | 05275819 | 10/1993 |
| JP | 5310487 | 11/1993 |
| JP | 7176871 | 7/1995 |
| JP | 07176871 | 7/1995 |
| JP | 8172265 | 7/1996 |
| JP | 08172265 | 7/1996 |
| JP | 08191184 | 7/1996 |
| JP | 8191184 | 7/1996 |
| JP | 9083135 | 3/1997 |
| JP | 09083135 | 3/1997 |
| JP | 09321399 | 12/1997 |
| JP | 9321399 | 12/1997 |
| JP | 10065339 | 3/1998 |
| JP | 10256687 | 9/1998 |
| JP | 11054909 | 2/1999 |
| WO | WO 86/06243 | 10/1986 |
| WO | WO8606243 | 10/1986 |
| WO | WO0013474 | 3/2000 |
| WO | WO 00/13474 | 8/2001 |

* cited by examiner

HOLE FILLING USING AN ETCHED HOLE-FILL STAND-OFF

This is a continuation-in-part of U.S. application Ser. No. 09/752,503, filed Dec. 28, 2000 now U.S. Pat. No. 6,506,332, which claims the benefit of U.S. Provisional Application No. 60/208,456, filed May 31, 2000. A related application having a similar title and the same inventors as this application is being filed concurrently. All of the foregoing applications are herein incorporated by reference in their entireties.

FIELD OF THE INVENTION

The field of the invention is the filling of electronic substrate vias and through holes.

BACKGROUND OF THE INVENTION

Electronic substrates such as printed wiring boards and interconnects often comprise plated vias and thru-holes. These holes (the terms "hole" and "holes" will often be used herein to refer to both vias and thru-holes if the text is applicable to both vias and thru-holes) are often filled with a conductive paste or other fill material, typically by forcing the material into the hole from one end of the hole. For the sake of this disclosure, the end of a hole through which fill material enters the hole will be referred to as the "entrance", and the opposite end of the hole as the "exit".

When filling holes, it is important that the exits of the holes not be in contact with any surface that will later be removed from the substrate before the fill material sets or cures. Thus, if one side of the substrate is resting on a tooling plate during the fill process, there should be some separation between the tooling plate and the exit of the hole in order to prevent material drag-out as the substrate is removed from the tooling plate.

However, such separation is not always easy to achieve. Substrates tend to be relatively flexible, and the filling process often exerts a downward force on the substrate. Thus, any mechanism used to provide the required separation must be adequate to maintain that separation while pressure is applied to the substrate. Providing proper separation is made more difficult because of the need to be able to handle a large number of different hole patterns as utilizing a single stand-off for multiple hole-patterns runs the risk of having portions of the stand-off intended to support the substrate positioned directly beneath a hole to be filled.

One method of supporting a substrate during filling is to provide a tooling plate or other support having through holes formed in it, placing the substrate to be filled on top of such a support in a manner that the holes to be filled align with through holes of the support, and filling the through holes. Examples of such supports and their use can be found in U.S. Pat. No. 6,276,055, U.S. Pat. No. 6,282,782, and GB2246912. Unfortunately, known supports tend to be inadequate in applications where a substrate comprises a larger number of holes having minimum separation between holes such as in a grid-array arrangement. In such an application, one might simply remove an entire area of the support corresponding to the area containing the holes, but doing so would leave that area of the substrate unsupported. Moreover, even if the support comprises individual holes rather than a removed area, there is a chance that the support will distort under the pressures applied during filling with a corresponding misalignment between the through holes of the support and the holes of the substrate. Known supports are often relatively expensive to manufacture as well.

Thus, there is a continuing need for improved methods and devices to facilitate hole filling.

SUMMARY OF THE INVENTION

An assembly is disclosed that includes an etched hole-fill standoff; a tooling plate contacting the etched hole-fill stand-off, the stand-off and tooling plate being aligned to each other; a device having holes to be filled removably contacting the stand-off, the stand-off and device being aligned to each other; the device and the stand-off each having at least one hole, the hole of the device being aligned with the hole of the stand-off. An assembly comprising an etched hole-fill standoff, the stand-off comprising an etched layer bonded to a non-etched layer. A method of filling holes in a substrate having a plurality of holes of be filled that includes the steps of providing an etched hole-fill stand-off, aligning the stand-off to a tooling plate, aligning the substrate to the stand off and placing the substrate in contact with the stand-off, and filling the plurality of holes of the substrate.

It is contemplated that the devices and methods disclosed herein will enable the manufacture of multiple stand-offs in much the same manner as printed circuit boards are processed, without requiring the drilling of over-sized holes in a blank substrate. In particular, the use of a printed wiring board ("PWB") laminate to form stand-offs for filling PWB's eliminates the need to purchase additional materials for the stand-offs, and eliminates the need for any special handling equipment directed to forming the stand-offs. It is also contemplated that the use of a PWB laminate and an etch based formation method permits better utilization of under utilized etching equipment rather than requiring the use of typically over utilized drills and routers.

Using an etched copper stand-off is contemplated to allow sufficient control over the formation of the stand-off to allow the stand-off to provide adequate support to a substrate even when adjacent holes of the substrate have minimal separation between them.

It is also contemplated that providing a stand-off in which an etched layer is bonded to a non-etched layer will help minimize the chance of distortion of the etched layer during use.

Various objects, features, aspects and advantages of the present invention will become more apparent from the following detailed description of preferred embodiments of the invention, along with the accompanying drawings in which like numerals represent like components.

DETAILED DESCRIPTION

Figure 1:
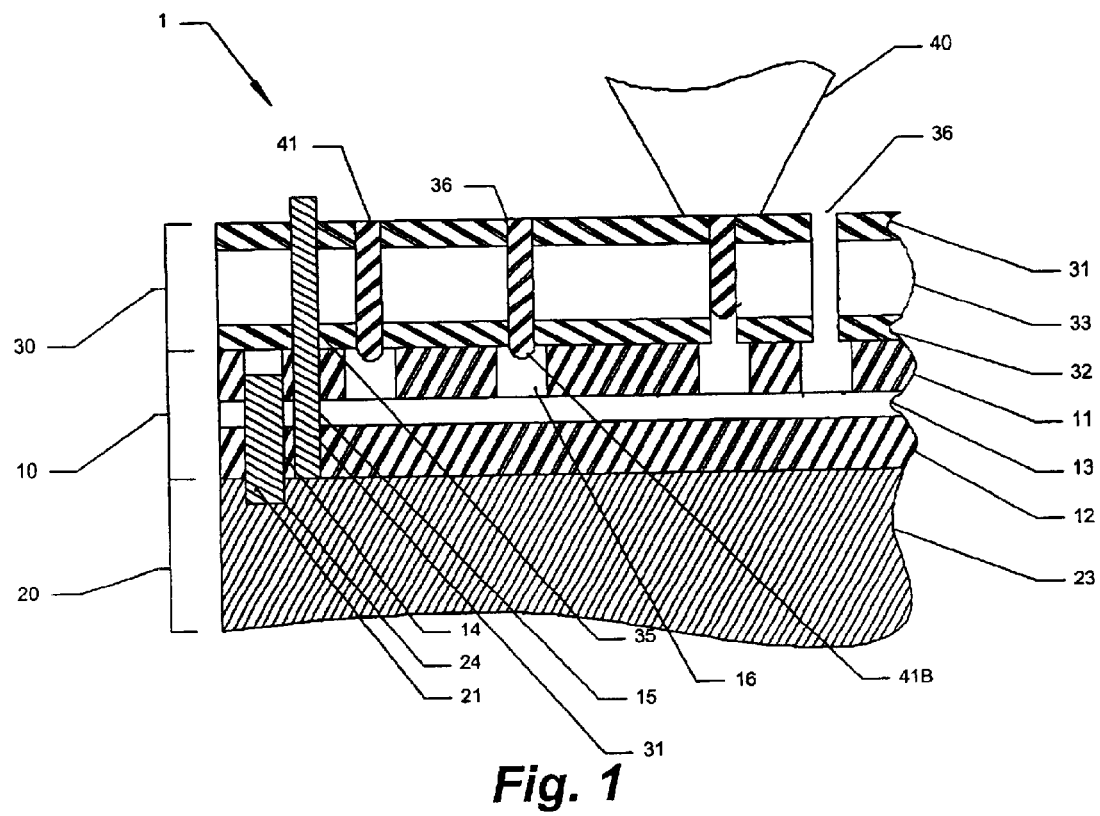
FIG. 1 is a partial cutaway side view of a fill mechanism and and an assembly of the present invention.
Figure 2:
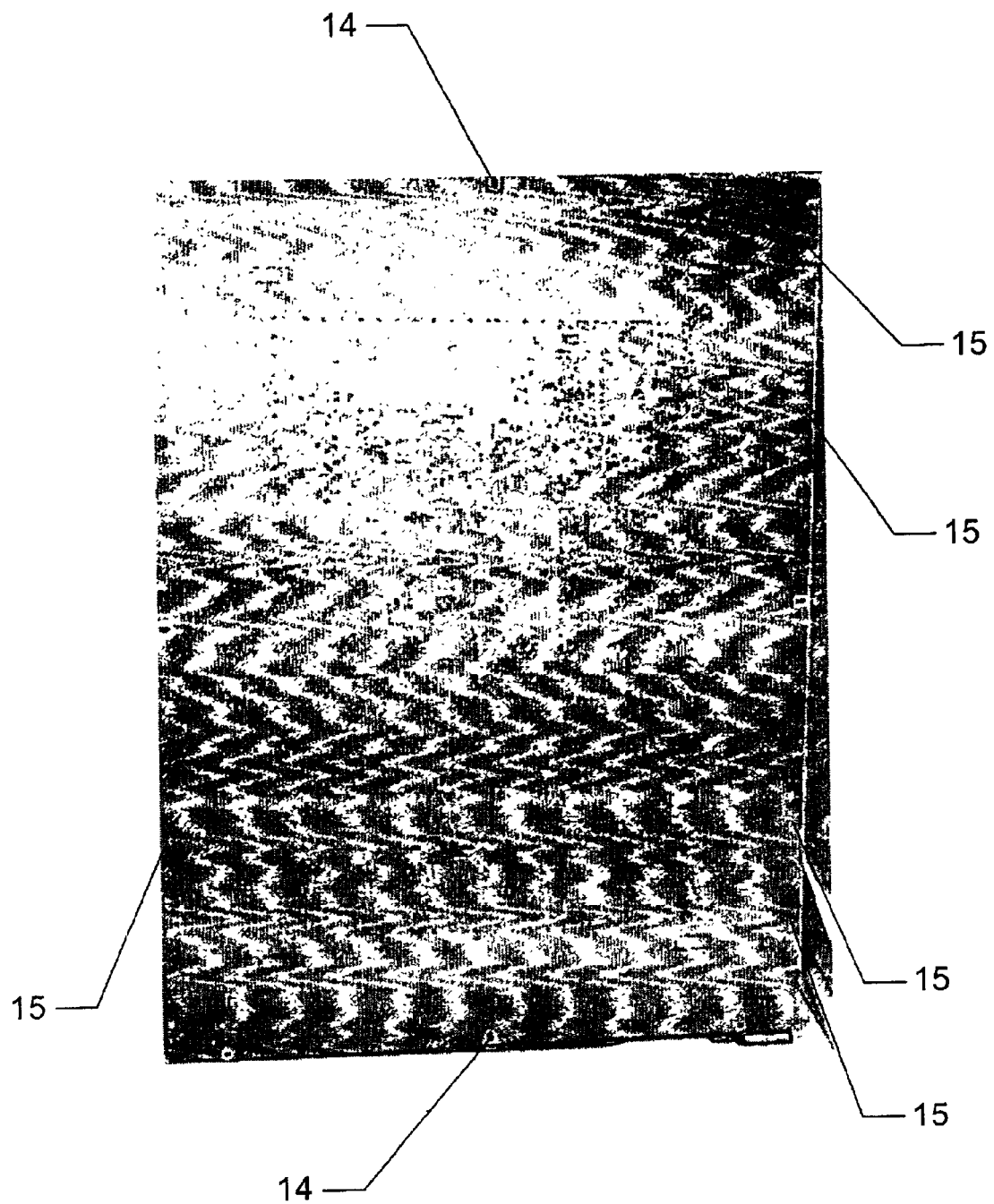
FIG. 2 is a top view of a standoff according to the present invention.

In FIG. 1, an assembly 1 includes a stand-off 10 comprising a double sided laminate having copper layers 11 and 12 on opposite sides of a dielectric core 13. Preferably, layer 11 is patterned, and layer 12 is a substantially solid plane. Layers 11 and 12 comprise tooling slots 14, tooling pin holes 15, and fill material receiving holes 16 that are essentially oversized holes. A tooling plate assembly 20 includes alignment pins 21 and tooling plate 23, and alignment pin receiving holes 24. A printed wiring board ("PWB") 30 includes tooling pins 31, tooling pin holes 35, and holes 36 as well as core 33 and copper layers 31 and 32. A filling mechanism/head 40 is shown filling holes 36 with fill material 41. For holes 36 already filled with fill material 41, a portion of fill material 41 extends into holes 16. FIG. 2 shows an etched stand-off similar to stand-off 10 of FIG. 1 having tooling slots 14 and tooling pin holes 15.

Stand-off 10 is preferably formed from Q-stock (double sided laminate material) having 5–10 oz. copper (layers 11 and 12) on both sides, or by laminating ½–12 oz. copper foil on both sides (layers 11 and 12) of G-10 or other substrate base material. Such a copper clad laminate is imaged using a modified version of art-work derived from a drill-file program of a particular PWB part number, and layer number (depending on which layers of a PWB are designated for drill). The holes within the pattern are imaged to 0.005"–0.100" per side, oversized from a stated finished diameter for each hole. The panel is then run through developers to form the pattern to be etched. The panel is then placed in an etch tank or processed through a conveyorized etcher to remove the copper from the areas not protected by the developed resist pattern on the stand-off panel, followed by stripping the resist from the panel and subsequent cleaning. Tooling holes are then drilled or routed into the panel before releasing it for use in the hole fill process. It should be noted that one can also plate up the copper thickness to unlimited thickness if required, and that small relief holes could be drilled using the existing drill program for each particular part number.

Tooling plate 23 can comprise any suitable supporting surface. Although the figure shows the use of pins 21 to align and affix stand-off 10 to tooling plate 23, any suitable means may be used to align and/or couple stand-off 10 to tooling plate 23.

In the preferred embodiment of FIG. 1, PWB 30 rests on top of stand-off 10 but is only bonded to stand-off 10 by pins 31. Similarly, stand-off 10 preferably rests on tooling plate 23, but is only bonded to tooling plate 23 by pins 21. In less preferred embodiments, stand-off 10 may be bonded, either temporarily or permanently to tooling plate 23, and/or may be temporarily bonded to PWB 30.

Although the figure shows assembly 1 as comprising a printed wiring board 30, any substantially planar device having holes to be filled could be used in place of printed wiring board 30 as long as the device and the stand-off 10 are adapted to be coupled to and aligned with each other so as to assure proper alignment between the pattern on stand-off 10 and the pattern on the device being filled.

Stand-off 10 may be advantageously used in conjunction with a hole-fill method that includes: providing stand-off 10; aligning the stand-off to a tooling plate; aligning the substrate to the stand-off and placing the substrate in contact with the stand-off; and filling the plurality of holes of the substrate. In such a method, it is preferred that providing an etched hole-fill stand-off comprises forming the stand-off previously described. As an example, it may be formed by imaging a copper clad laminate with an image similar to that used to image a surface of the substrate, and subjecting the imaged laminate to develop-etch-strip processing to form a pattern in a copper surface of the laminate, the pattern having a plurality of holes, each of the plurality of holes corresponding to a hole to be filled of the substrate, the laminate holes being at least slightly larger in diameter than their corresponding substrate holes. The foregoing method would typically also comprise filling the through holes of the substrate with a fill material such that the fill material extends at least partially into the holes of the stand-off, and removing the substrate from the stand-off wherein substantially all of the fill material extending into the stand-off remains after removal of the stand-off.

An image "similar" to that used on a surface of the substrate being filled will likely have the same pattern of through holes but with the through holes having a larger diameter than provided for in the pattern for the substrate.

It is contemplated that the methods and devices disclosed herein are particularly advantageous when used with a device such as PWB 30 wherein the artwork used to determine the locations of the various holes is available in a form that permits it to be easily modified and re-used to form the similar pattern on stand-off 10.

It is contemplated that assembly 1 may be advantageously used when tooling plate 23 and stand-off 10 are part of a hole fill system that also comprises a pressurized fill head such as fill head 40 of FIG. 1.

Thus, specific embodiments and applications of etched hole-fill stand-offs have been disclosed. It should be apparent, however, to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

What is claimed is:

1. A method of filling holes in a substrate having a plurality of holes to be filled comprising:

providing an etched hole-fill stand-off comprising missing a copper clad laminate with an image similar to that used to image a surface of the substrate, and subjecting the imaged laminate to develop-etch-ship processing to form a pattern in a copper surface of the laminate, the pattern having a plurality of holes, each of the plurality of holes corresponding to a hole to be filled of the substrate, the laminate holes being at least slightly larger in diameter than their corresponding substrate holes;

aligning the stand-off to a tooling plate;

aligning the substrate to the stand-off and placing the substrate in contact with the stand-off; and filling the plurality of the holes of the substrate.

2. The method of claim 1 further comprising filling the boles of the substrate with a fill material such that the fill material extends at least partially into the holes of the stand-off.

3. The method of claim 2 further comprising removing the substrate from the stand-off wherein substantially all of the fill material extending into the stand-off remains after removal of the stand-off.

4. A method of claim 1 wherein filling the plurality of holes of the substrate utilizes a pressurized fill head while maintaining proper alignment between the plurality of holes in a substrate and holes of the stand-off.

* * * * *